United States Patent
Bruwer et al.

(10) Patent No.: US 9,360,510 B2
(45) Date of Patent: *Jun. 7, 2016

(54) PARASITIC CAPACITANCE CANCELLATION IN CAPACITIVE MEASUREMENT

(71) Applicant: AZOTEQ (PTY) LTD, Paarl (ZA)

(72) Inventors: Frederick Johannes Bruwer, Paarl (ZA); Johann Swanepoel, Paarl (ZA); Dieter Sydney-Charles Mellet, Paarl (ZA); Douw Gerbrandt Van Der Merwe, Paarl (ZA)

(73) Assignee: AZOTEQ (PTY) LTD, Paarl (ZA)

( * ) Notice: Subject to any disclaimer, the term of this patent is extended or adjusted under 35 U.S.C. 154(b) by 154 days.

This patent is subject to a terminal disclaimer.

(21) Appl. No.: 14/188,658

(22) Filed: Feb. 24, 2014

(65) Prior Publication Data

US 2014/0285220 A1    Sep. 25, 2014

Related U.S. Application Data

(63) Continuation of application No. 13/061,144, filed as application No. PCT/ZA2009/000091 on Oct. 15, 2009, now Pat. No. 8,659,306.

(30) Foreign Application Priority Data

Oct. 15, 2008  (ZA) ................................. 2008/08832

(51) Int. Cl.
*G01R 27/26*   (2006.01)
*G01D 5/24*    (2006.01)
*H03K 17/955*  (2006.01)
*G01D 5/241*   (2006.01)

(52) U.S. Cl.
CPC .............. *G01R 27/2605* (2013.01); *G01D 5/24* (2013.01); *G01D 5/241* (2013.01); *H03K 17/955* (2013.01); *G01D 5/2412* (2013.01); *G01D 5/2417* (2013.01); *H03K 2217/960725* (2013.01)

(58) Field of Classification Search
CPC ... G01R 27/2605; G06K 9/0002; G01D 5/24; G01D 5/241; G01D 5/2412; G01D 5/2417; H03K 17/955; H03K 2217/960725
USPC ......... 324/659, 658, 649, 600, 684, 686, 679, 324/678; 702/47, 52
See application file for complete search history.

(56) References Cited

U.S. PATENT DOCUMENTS

| | | | |
|---|---|---|---|
| 5,730,165 A * | 3/1998 | Philipp | E03C 1/057 137/1 |
| 7,262,609 B2 * | 8/2007 | Reynolds | G01D 5/24 324/678 |
| 8,395,395 B2 * | 3/2013 | Bruwer | H03K 17/16 178/18.06 |
| 8,659,306 B2 * | 2/2014 | Bruwer | H03K 17/955 324/678 |
| 2009/0224776 A1 * | 9/2009 | Keith | H03K 17/962 324/686 |

* cited by examiner

*Primary Examiner* — Hoai-An D Nguyen
(74) *Attorney, Agent, or Firm* — William A Blake (57) ABSTRACT

An integrated circuit compensates for parasitic capacitance in a capacitive measuring apparatus wherein a capacitance measurement is done by repeatedly transferring charge from a capacitor to be measured to a reference capacitor.

17 Claims, 11 Drawing Sheets

PARASITIC CAPACITANCE CANCELLATION IN CAPACITIVE MEASUREMENT

BACKGROUND OF THE INVENTION

This invention relates to the compensation of parasitic or unwanted capacitance in capacitance measurement applications.

Methods of using capacitance measurement to detect the proximity and/or vicinity of an object are known in the art. Inherent parasitic capacitances associated with sense plates, switches, connections and wiring degrade performance in these applications. The same holds true for other capacitance measurement applications. A specific capacitance measurement technique of importance is the "charge transfer method".

This invention aims to provide a technique to compensate for these parasitic capacitances and thus improve performance.

The invention also relates to an embodiment of the charge transfer method that overcomes the effect of non-linearity in a charging capacitor and enables scaling of a capacitor so that the method can be implemented practically and economically on standard CMOS integrated circuits.

SUMMARY OF THE INVENTION

According to the invention the capacitance measurement is done by repeatedly transferring charge from a capacitor to be measured ($C_M$) to a reference capacitor ($C_R$).

The reference capacitor ($C_R$) starts in a known initial state (e.g. 0V). The measured capacitor $C_M$ is charged to a known state (e.g. Vdd). Charge is transferred from $C_M$ to $C_R$. One such cycle is defined as a "Charge Transfer Cycle". As more Charge Transfer Cycles are performed the charge, and thus the voltage, on $C_R$ increases. The Charge Transfer Cycles continue until $C_R$ reaches a specific voltage level (trip level). The time to charge the reference capacitor from the initial state to the trip level is defined as the "measurement period". The number of transfers in the measurement period is an indication of the size of $C_M$.

In each Charge Transfer Cycle an additional unwanted amount of charge is transferred from $C_M$ to $C_R$ because of parasitic capacitances ($C_P$) in the circuit. This invention relates to the removal of this additional unwanted charge originating from the parasitic capacitances ($C_P$), from $C_R$, during each Charge Transfer Cycle so that only the charge from $C_M$ remains on $C_R$ after a Charge Transfer Cycle. This compensates for the effect of the parasitic capacitances ($C_P$) and only the wanted, measured capacitance on $C_M$ is measured.

The sensitivity of the process can be increased by reducing the effective value of $C_M$. This means that not only can the parasitic capacitances be removed, but that $C_M$ can be adjusted to have a specific capacitance. This must be done without a physical change to the sensor structure (sense plate/antenna). One way to implement this is described hereinafter.

The above capacitance measurement method is still applicable if the reference capacitor ($C_R$) and measured capacitor ($C_M$) are interchanged.

Another charge transfer measurement technique is to perform a set number of Charge Transfer Cycles and measure the final voltage on the reference capacitor $C_R$. This method is described in detail in U.S. Pat. No. 7,148,704 by Phillip and in other literature. The same method of compensation for parasitic capacitances ($C_P$) as described above can also be applied for other charge transfer and general capacitive measurement techniques.

In an embodiment, the effect of parasitic capacitance ($C_P$) is cancelled by removing the same amount of charge that the $C_P$ added to $C_R$ in each Charge Transfer Cycle. Unfortunately for many capacitance measurement methods, the amount of charge the $C_P$ and $C_M$ capacitors add to $C_R$ in each Charge Transfer Cycle is not the same from one Charge Transfer Cycle to the next. Thus the amount of charge that has to be removed from $C_R$ to compensate for the effect of the $C_P$ capacitor has to change as well. This removal of charge is accomplished by pre-charging a compensation capacitor ($C_C$) and then connecting this $C_C$ to the $C_R$ capacitor. This connection is such that the net change in voltage of the $C_C$ capacitor from the pre-charge value to the final value after connection to $C_R$ ($\Delta V_{Cc}$), is the same value but of opposite sign as the change in voltage of $C_P$ ($\Delta V_{CP}$) from its pre-charged value (e.g. Vdd) to its final value (e.g. voltage on the $C_R$ capacitor ($V_{CR}$)). Thus if $C_P$ and $C_C$ are of equal value and because the changes in voltage on $C_P$ and $C_C$ are the same value but of opposite sign ($\Delta V_{CP} = -\Delta V_{Cc}$) for each Charge Transfer Cycle, the charge $C_P$ adds to $C_R$, and the charge $C_C$ removes from $C_R$, are the same. Thus the effect of the parasitic capacitance ($C_P$) is cancelled.

In another embodiment of the invention, parasitic capacitance cancellation is handled by means of a current mirror structure. A capacitor $C_{PC}$ that defines the parasitic capacitance to be cancelled is charged or discharged after being charged to the same value as $C_M$ (e.g. Vdd). The current flowing is then mirrored and extracted from $C_R$. This $C_{PC}$ is not necessarily the real parasitic capacitance in the circuit, it is merely a user or designer defined parameter. This has two significant advantages.

Firstly, the current mirror structure is well suited for scaling the current. Thus the reference current ($I_R$) flowing from $C_{PC}$ can be mirrored ($I_R:I_S$). The notation 1:1 means the exact same current will flow in the secondary circuit; 1:0.5 (or 2:1) gives 50% of the current in the secondary; and 1:2 results in the current in the secondary circuit being doubled. This enables the designer to scale the capacitors, such as $C_{PC}$, in order to optimise for performance, cost, signal to noise ratio or other design parameters.

Secondly, since the charge on $C_R$ continuously changes as $C_R$ is being charged to the trip level, it is not that simple to remove the correct charge in a constant manner. However, in this embodiment the $C_{PC}$ is charged to a fixed level or discharged from a fixed level to create the reference current. Because of the current mirror operation and characteristics the secondary circuit current ($I_S$) flowing from $C_R$ is independent of the voltage level of $C_R$. This means the charge added to $C_R$ due to the parasitic capacitance can be removed in a way that is constant in every charge/discharge cycle i.e. essentially in the same way that it is added. This provides for a linear operation in removing charge from the $C_R$. This, coupled with the implementation described below for handling the charge transfers from $C_M$ in the same manner, allows a more linear system is achieved.

In a further embodiment of a charge transfer measurement implementation of capacitive sensing or other sensing (e.g. inductive) the same current mirror structure is used in the discharge cycle of $C_M$. So, instead of discharging $C_M$ into $C_R$ as is common in the art, with the same non-linearity problem due to the rising voltage level in $C_R$, $C_M$ is discharged through the current mirror to a fixed voltage (e.g. ground). This creates a reference current ($I_R$) and can, again through a current mirror element or similar structure, be used to form a related current ($I_S$) in a secondary circuit. This current can be made to flow into $C_R$ transferring the related charge. Due to the characteristics of the current mirror element the current is independent of the voltage level on $C_R$ and as such results in the linear charging of $C_R$ because the amount of charge transferred is related to the charge flowing from $C_M$ and not to the voltage level of $C_R$.

In a further embodiment the current mirror or other mirror element can have a ratio between the $I_R$ and $I_S$ currents. For example if the ratio is a step down ratio of a 1000 then it is possible to reduce the value of $C_R$ a 1000 times and still get the same number of transfers. This means a $C_R$ that may not be practical to embed in a normal CMOS IC (e.g. 20 nF) can be reduced to a value that can very reasonably be implemented on-chip (e.g. 20 pF). This results in significant savings in cost through reducing discrete components (cost and manufacturing) as well as reducing pin count, or coupling of noise.

Thus, in accordance with the invention, the scaling of charge is used in a charge transfer measurement circuit to facilitate integration of capacitive elements into a standard CMOS integrated circuit.

According to a different aspect of the invention there is provided a parasitic capacitance cancellation circuit in which scaling of charge is effected through a current mirror structure to scale capacitive elements that define or determine the charge which is to be removed from $C_R$ during each charge transfer cycle.

The current mirror structure may result in a removal of charge from a reference capacitor in a way that is independent of the voltage level of the reference capacitor.

The invention also extends to a parasitic capacitance cancellation method in which unwanted additional charge which is transferred by a parasitic capacitor to a reference capacitor is removed by a separate compensation capacitor. The term "parasitic capacitance cancellation" is used in a general sense and extends to the cancellation of capacitance inherent to the antenna, sense plate or sensor electrode structure.

Preferably the unwanted additional charge from the parasitic capacitor is removed during each Charge Transfer Cycle. In a variation of the method the unwanted additional charge from the parasitic capacitor produced in one Charge Transfer Cycle is removed during a following Charge Transfer Cycle.

The removal of some of the intrinsic capacitance of the sensor plate is a very powerful technique to enhance or amplify sensitivity. Normally, increasing the size of a sense plate has two opposing effects in that although coupling with an object (say a user hand) is improved, the inherent capacitance of the sense plate is increased. Since a change in capacitance (delta) is measured, the increased inherent capacitance has a negative impact.

In a further embodiment a capacitance cancellation circuit is implemented using the current mirror structure and any applicable ratio for extracting current from $C_R$. However, instead of using capacitors to be charged in order to create the reference charge for the cancellation, a reference current is used that flows for a defined period of time. The advantage of this is that it addresses a situation in which extremely small capacitors (femtofarad range) are used in some designs in which the effects of layout (parasitic) capacitance, formed in the lines and as part of the active components, are difficult to plan and simulate.

The capacitance measurement approach can also benefit from an algorithm designed to obtain certain performance objectives. For example, the goal may be sensitivity in which case it would be beneficial to remove as much capacitance as is practical through the capacitance cancellation method or circuit. However, if stability is the main focus then the choice of a larger reference capacitor is better and as such forces a lower capacitance cancellation value. The algorithm needs to take into account the interplay between at least the following group of parameters or subsets thereof: the counts per measurement, the reference capacitor size, the amount of capacitance cancellation, current mirror ratios, the noise in the environment, the transfer frequency, etc.

In practice it has also been found that the use of current mirrors and capacitance cancellation introduces noise into the circuit during some CMOS manufacturing processes. This noise may be described as 1/f noise, Popcorn Noise or Random Telegraph Signal Noise (much is written about this in the literature), and is difficult to remove when present in a process. In general this noise is linked to traps formed in the silicon. For ease of reference this noise is referred to as RTS noise to differentiate it from other random, environmental and system noise.

Because the noise specifically "looks" like or can manifest itself in signals as a genuine signal related for example to a proximity event, it does interfere with operation of the measurement circuit. As such, it is desirable to be able to detect the presence of RTS noise and then to remove the effect of the RTS noise.

To detect the RTS noise it is possible to look for sudden variations or jumps in measurements, but this may coincide with, or may be similar in form to, normal operational events from sense plate signals. However, if the same parts of the measurement circuit (e.g. current mirror and capacitance cancellation circuit) are used to maintain a measurement on the inside of the IC then external events cannot cause a change in the measurement. This internal measurement can then be used to indicate the presence or absence of such noise. In a very simple embodiment this indication of presence of RTS noise may be used to inhibit proximity detections/indications at the time, but still allow touch indications because the RTS noise is not big enough to cause such false measurements.

In a further improvement the change in measurement caused by the RTS noise is quantified and then removed from the measurement signals to yield a "clean" signal on which detection decisions are based. This may be done through analysis of the change in value of the measurement on the internal system, with no external sense plate and only internal components (e.g. fixed capacitors inside the IC for $C_M$ and $C_R$), or by monitoring the external signal and measuring changes that occur at the time of RTS noise detection or when the noise falls away. In both cases a quantum of the noise influence on the signal can be determined and the effect thereof removed. In one example such quantum may be added or removed from the long term average to effectively negate its effect in the measurement system.

BRIEF DESCRIPTION OF THE DRAWINGS

The invention is further described by way of examples with reference to the accompanying drawings in which.

DESCRIPTION OF PREFERRED EMBODIMENTS

Figure 1:
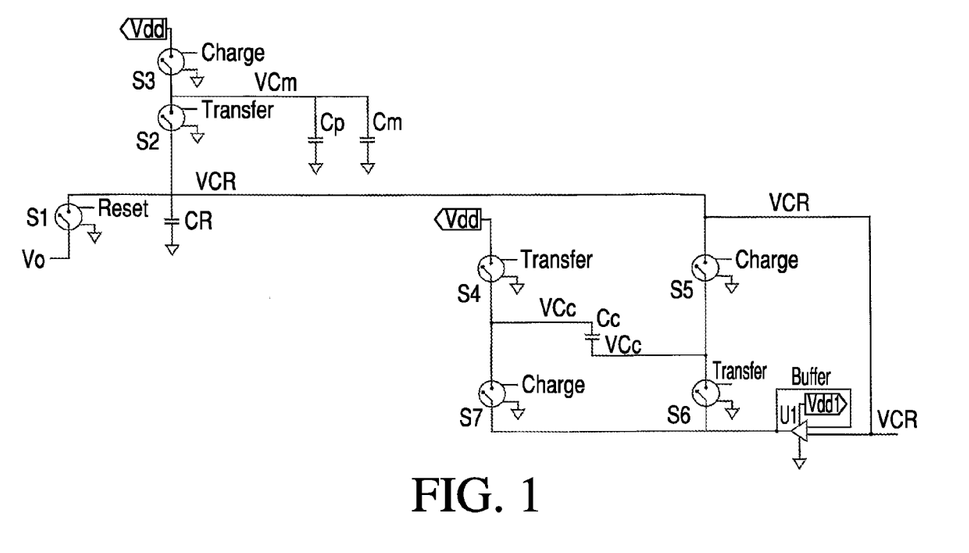
FIG. 1 shows a charge transfer circuit with a parasitic capacitance cancellation circuit.

FIG. 1 shows a charge transfer circuit as well as a parasitic capacitance cancellation circuit.

Before a "measurement period" a reference capacitor ($C_R$) is initialized to a known voltage Va (e.g. 0V) by closing a switch S1.

Figure 2:
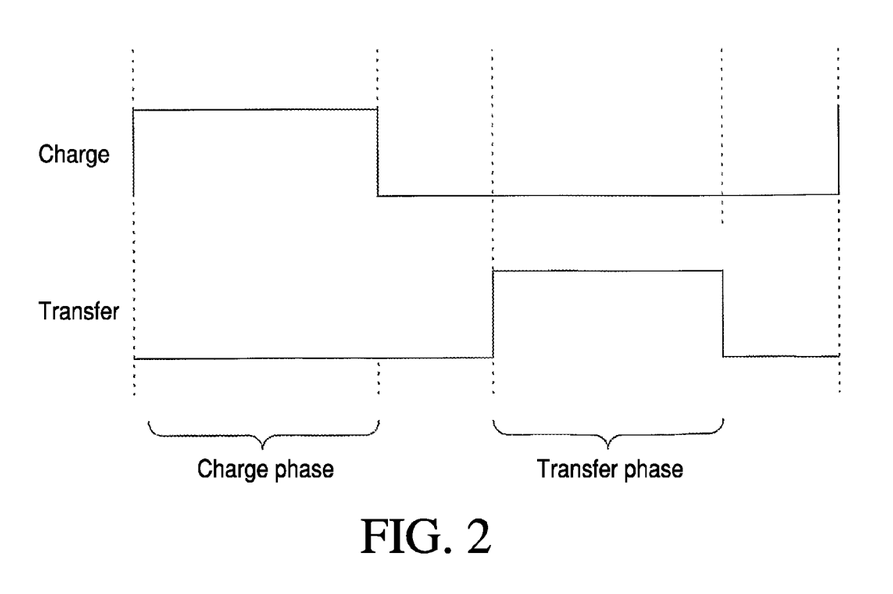
FIG. 2 shows charge (UP) and transfer (PASS) signals.

The Charge Transfer Cycle consists of at least 4 phases, viz the Charge Phase (UP), the Transfer Phase (PASS) and two Deadtime Phases (FIG. 2) which ensure that the Charge Phase and the Transfer Phase do not overlap. During the Charge Phase switches S3, S5 and S7 are closed and switches S2, S4 and S6 are open. A measured capacitor ($C_M$) as well as the parasitic capacitance ($C_P$) are charged to a reference voltage (Vdd).

During the Transfer Phase the switches $S_2$, $S_4$ and $S_6$ are closed and the switches $S_3$, $S_5$ and $S_7$ are open. Capacitors $C_M$ and $C_P$ are connected to the reference capacitor ($C_R$) and charge is transferred from $C_M$ and $C_P$ to $C_R$. The voltage on $C_R$ at the end of the Transfer Phase is $V_{CR}$.

Thus, during each Charge Transfer Cycle, the parasitic capacitance ($C_P$) adds $C_P$ (Vdd–$V_{CR}$) charge to $C_R$. This is the amount of charge that the parasitic capacitance cancellation circuit must remove during each Charge Transfer Cycle.

During the Transfer Phase (FIG. 4), a compensation capacitor $C_C$ is pre-charged to (Vdd–$V_{CR}$) and thus $C_C$ has a charge of $C_C$ (Vdd–$V_{CR}$). This charge is supplied by the buffer and the supply voltage (Vdd). No charge is added to or removed from $C_R$.

During the Charge Phase (FIG. 3) the charge on $C_C$ is decreased to 0. The charge needed to change the charge on $C_C$ from $C_c$ (Vdd–$V_{CR}$) to 0, is removed from $C_R$. The VCc+ terminal of the $C_C$ capacitor is connected to a buffer output and the VCc– terminal is connected to $C_R$. This connection configuration causes charge to be removed from $C_R$ as the $C_C$ capacitor discharges from (Vdd–$V_{CR}$) volt to 0 volt.

Figure 3:
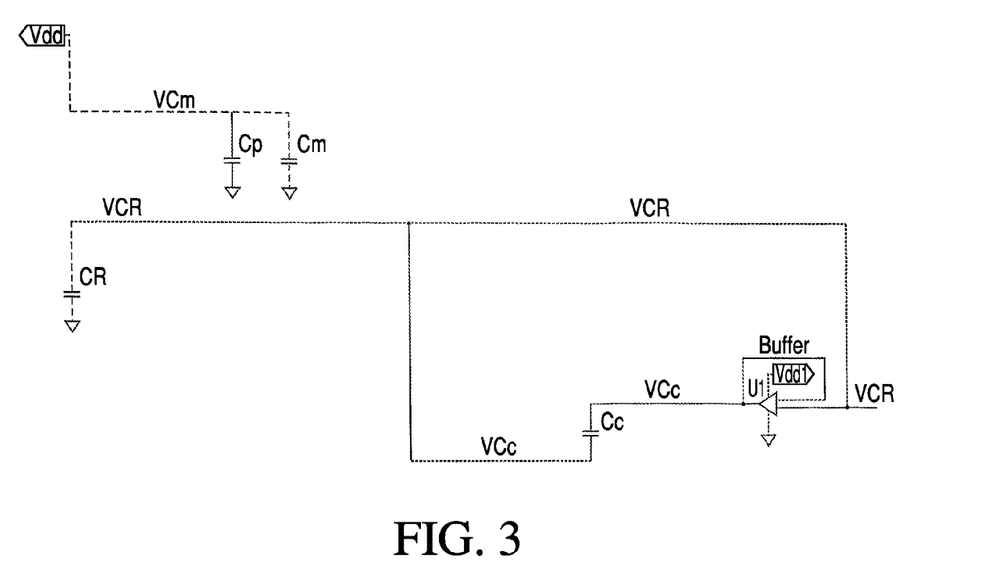
FIG. 3 depicts a charge transfer circuit and capacitance cancellation circuit during a charge phase.
Figure 4:
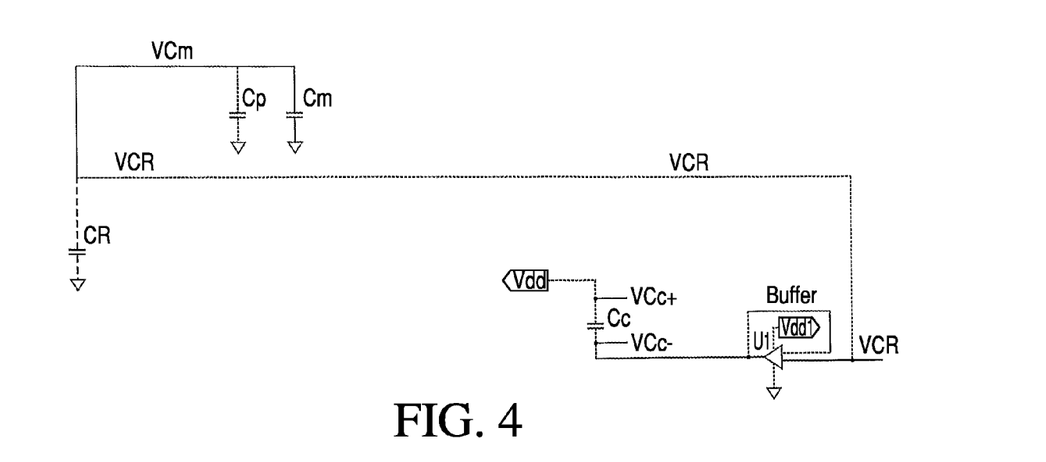
FIG. 4 depicts the charge transfer and parasitic capacitance cancellation circuit during a transfer phase.

Thus if $C_p=C_c$, the additional charge that the parasitic capacitance ($C_P$) adds to $C_R$ during each Charge Transfer Cycle, is removed by the compensation capacitor ($C_C$) in the next Charge Transfer Cycle and the net gain of charge on $C_R$ is only because of $C_M$. The effect of the parasitic capacitance $C_P$ is thus cancelled.

Figure 5:
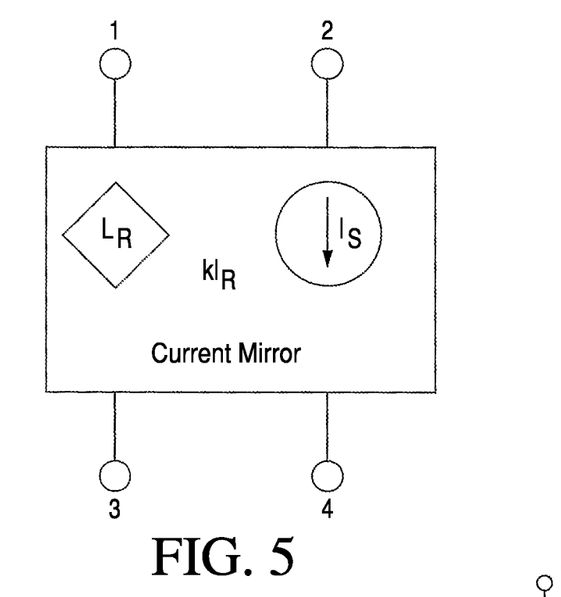
FIG. 5 is a graphical representation of the definition of a mirror structure.

FIG. 5 shows graphically the mirror structure required. The circuit is connected so that a reference current ($I_R$) flows between nodes 1 and 3. The current mirror ratio structure (k defines the ratio between $I_S$ and $I_R$) then results in a derived current ($I_S$=k$I_R$) flowing between nodes 2 and 4. k is a factor determined by the designer. If k=1 then the currents are the same; if k<1 then $I_S$ is smaller than $I_R$, and if k>1, $I_S$ is larger than $I_R$.

Figure 6:
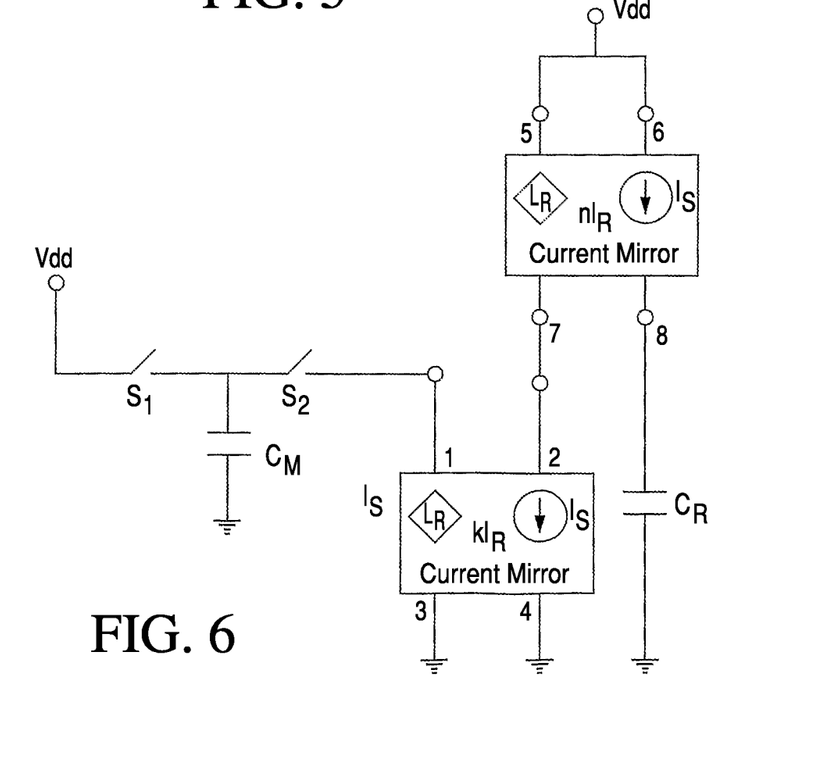
FIG. 6 shows a two stage current mirror structure to transfer charge from $C_M$ to $C_R$.

In FIG. 6 the mirror element is shown in a general circuit for charge transfer measurement. $C_M$ (the capacitor the value of which must be measured) is charged through $S_1$ (Charge Phase) and then discharged to ground through $S_2$ (Transfer Phase). The resulting current ($I_R$) flows through the current mirror element between nodes 1 and 3. This results, in accordance with the method of operation of the mirror element, in a current k$I_R$ flowing between nodes 2 and 4. This same current is connected to a second mirror ratio structure and this results in a current n(k$I_R$) flowing between nodes 6 and 8. In this example the initial reference current $I_R$ is multiplied first by a factor k and then by a factor n. In a specific situation k and n are each smaller than 1. This current forces charge into $C_R$, charging it with a charge that is related through the factor nk with the charge flowing from $C_M$ to ground. This technique results in a linear charging of $C_R$ i.e. the voltage level on $C_R$ rises in equal steps for each Charge Transfer Cycle and does not fall away as results from charging $C_M$ directly into $C_R$. After each Charge Transfer Cycle the voltage level on $C_R$ can be checked to see if a trip level has been reached.

The values of n and k can be chosen to meet certain objectives, for example to limit the value of $C_R$ due to size or cost considerations e.g. if k=0.1 and n=0.01 then the charge transfer is reduced by a factor of 1000.

The current mirror can be a single current mirror or use can be made of two or more current mirrors. This does not affect the implementation of the invention. The two stage implementation is merely an example that works well in practice.

Figure 7:
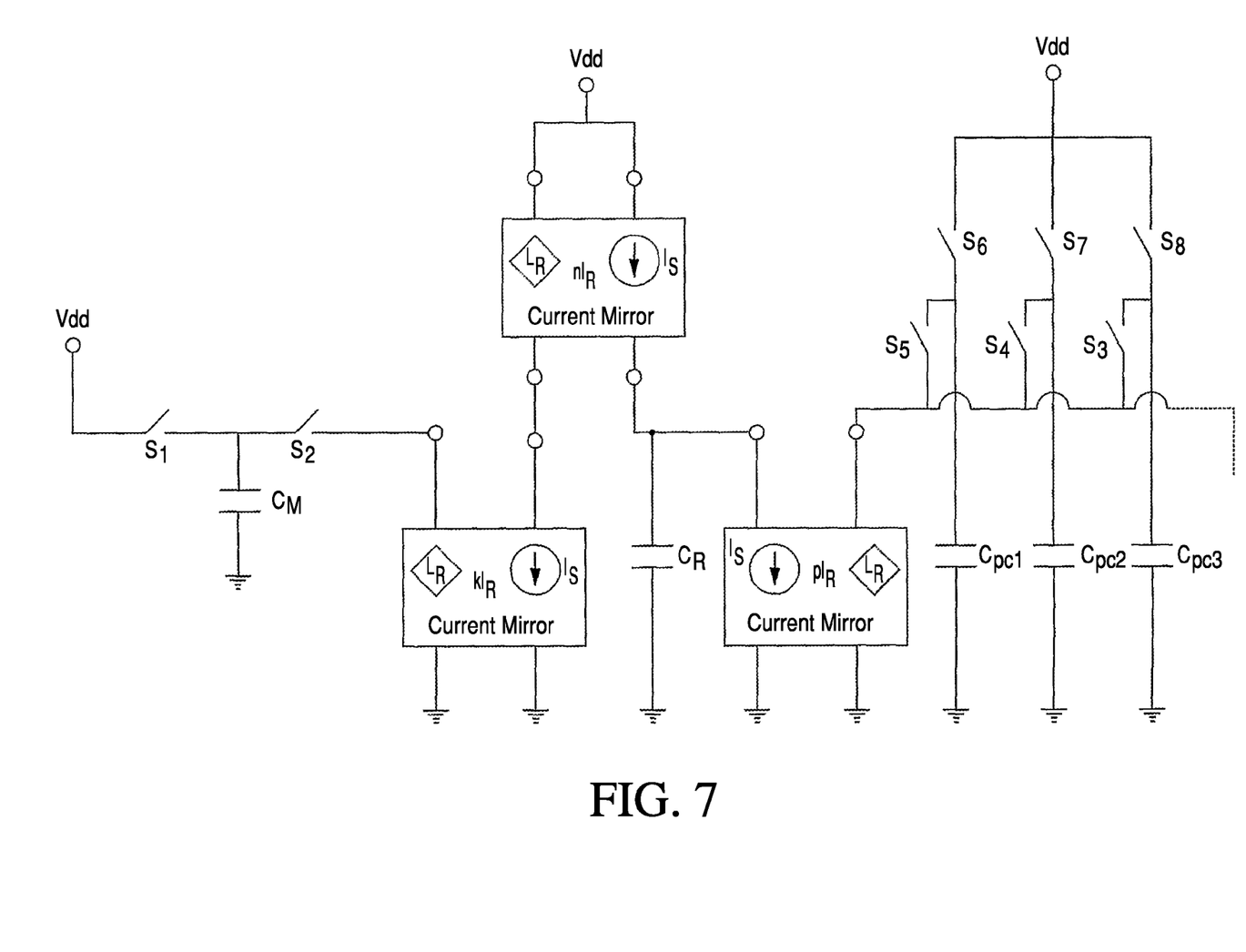
FIG. 7 shows a charge transfer circuit which uses a mirror method of parasitic capacitance cancellation.

FIG. 7 shows the parasitic capacitance cancellation structure. The value of parasitic capacitance to be cancelled can be selectively varied through the various switches available. If the three capacitors shown are used more charge will be removed from $C_R$ every cycle.

Through switches S6, S7 and S8 the capacitors are charged. The capacitors are discharged through the switches $S_3$, $S_4$ and $S_5$ to ground, creating a reference current. The mirrored and scaled currents then flow through the secondary nodes of the current mirror structure resulting in charge being removed from $C_R$.

During very low voltage levels on $C_R$, the structure does not operate well and the charge removed will not reflect the desired parasitic capacitance to be removed. However, in this application it is believed that the negative effect is negligible and is far outweighed by the positives.

The switching selection of the capacitors can be done under software control to automatically calibrate products for optimum operation. For example, a product can be designed and the PCC (parasitic capacitance cancellation) can be used to tune automatically for, say, 4000 transfers, when no touch is present. In this way manufacturing variations can be compensated for.

This means a sensor can be "tuned" to have a certain capacitance and hence a standard level of performance can be achieved over production. It is thus possible to use various current mirror ratios, different size reference capacitors, various capacitance cancellation values and an algorithm to adjust these to obtain specific transfer counts for a fixed trip level with various objectives such as sensitivity (proximity distance), stability, noise immunity, reaction time and number of charge transfer cycles, to reach a specific voltage level (trip level) and sample frequency. These features can be achieved on a single integrated circuit coupled with a sense plate without the need for external capacitors.

The adjustment of a trip level can also be used in an equivalent way to adjusting the $C_R$ value. Moving the trip level higher is equivalent to enlarging the $C_R$ and vice versa.

Figure 8A:
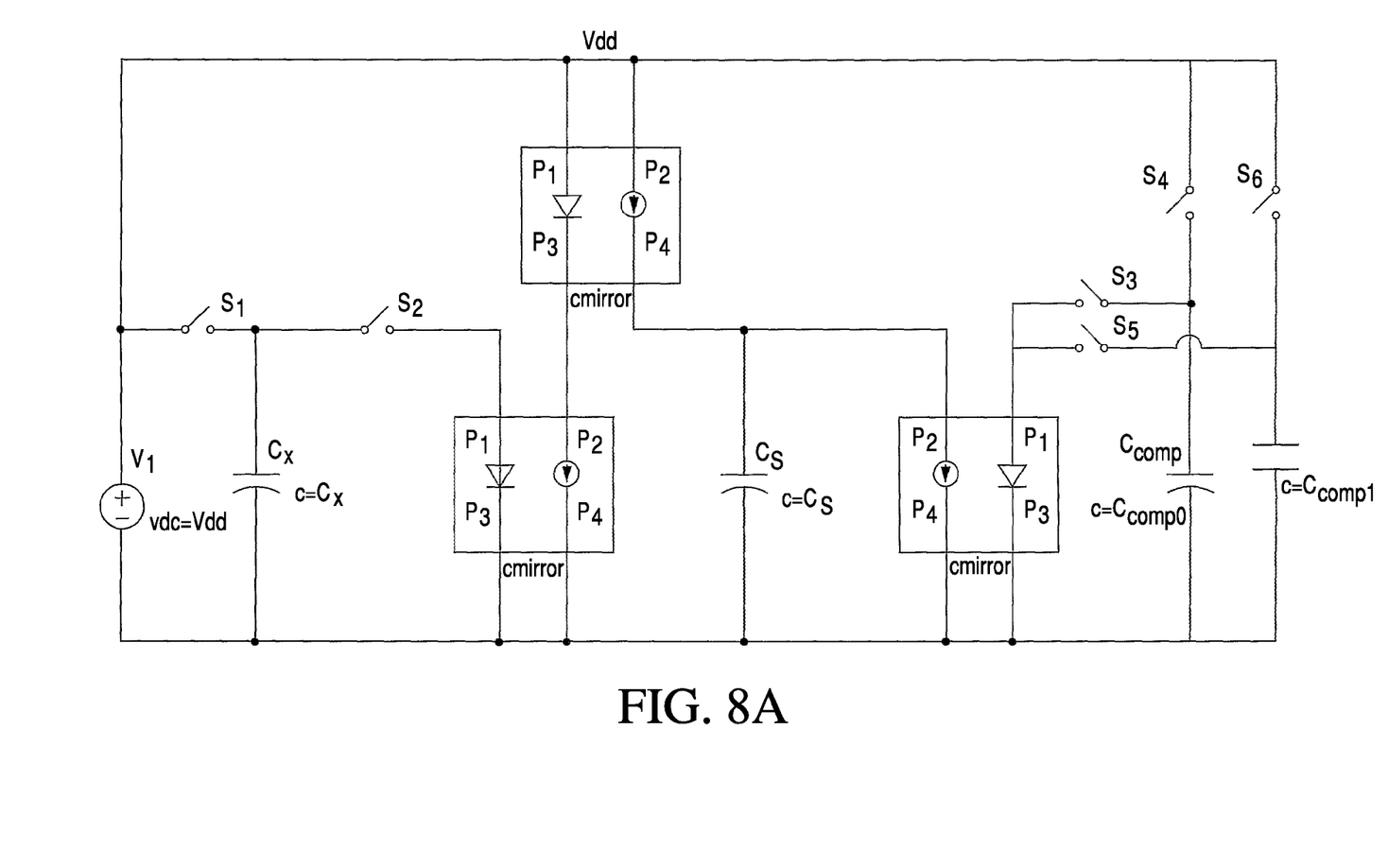
FIGS. 8A and 8B respectively show two forms of a cascade mirror structure with a current based capacitance cancellation circuit.
Figure 8B:
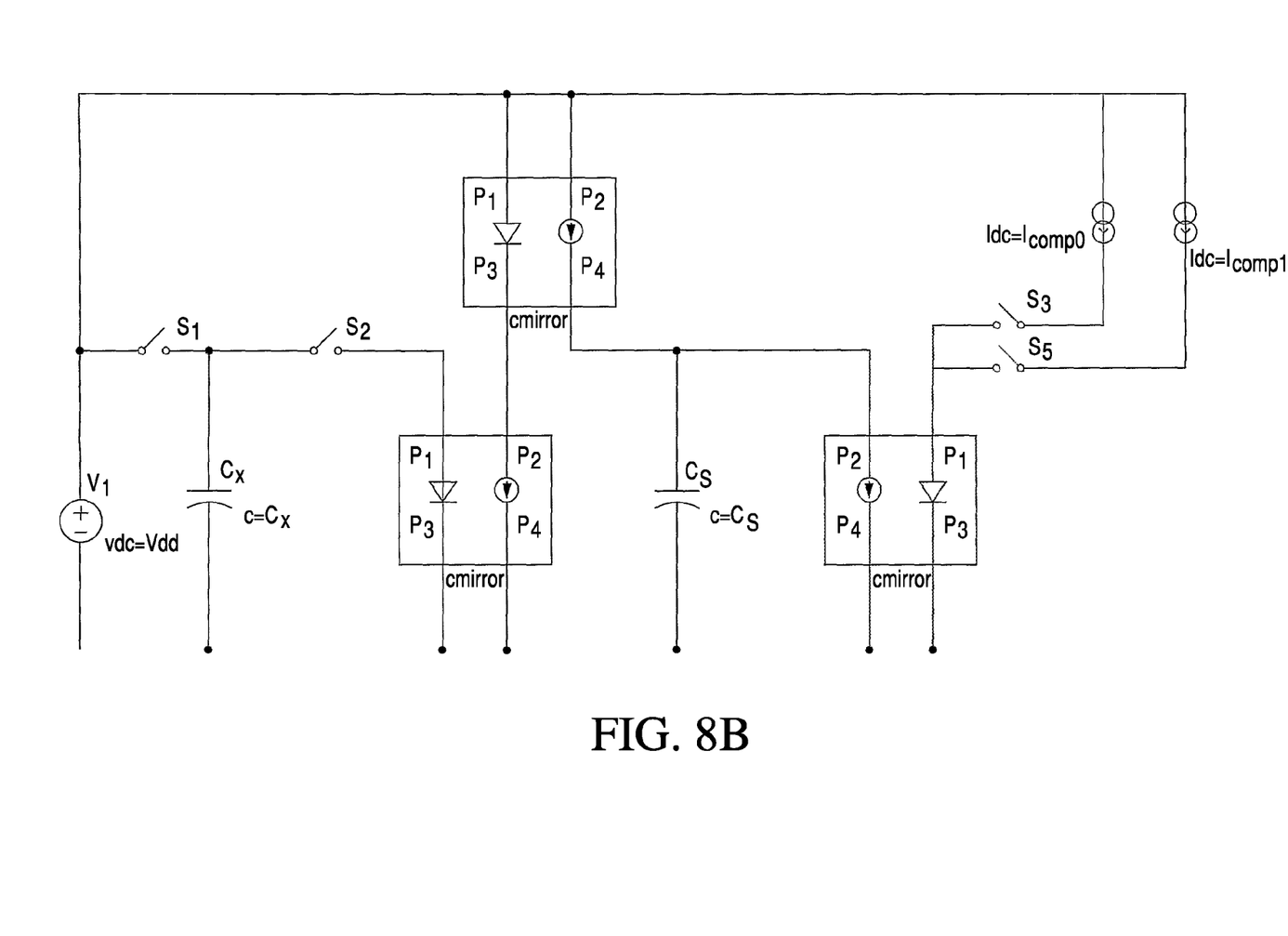

FIGS. 8A and 8B show how the charge to be removed during capacitance cancellation can be determined by choosing between various reference current sources (FIG. 8B) rather than capacitors (FIG. 8A). A capacitor charged to a specific voltage contains a defined charge. This charge, divided or multiplied via current mirror ratios, is used to define the charge that is removed in the capacitance cancellation technique. The same effect (FIG. 8B) can be achieved using current as a reference for the charge, instead of capacitance. A defined current flowing for a specific period of time also defines a charge. The charge can be taken out of $C_R$ using a current during the complete cycle or during a portion of each cycle. All that is required is that the period (i.e. main oscillator) and amplitude of current remain stable. As mentioned before this may be attractive in terms of implementation on silicon. The charge may also be determined by another technique applicable to the specific situation without affecting the other teachings and advantages of this invention.

Currents are in general more stable and noise immune than voltages. On silicon (CMOS) it is also possible to generate a range of current references, using mirror structures and other techniques, that are well matched and less affected by layout parasitic effect than, for example, capacitors. The use of currents to remove charge from the $C_R$ can also have advantages for the capacitive cancellation implementation in the sense that switching every Charge Transfer Cycle is not needed for the cancellation circuit. The cancellation current can flow continuously and as long as the charge transfer frequency is stable a fixed ratio between charge added from the $C_M$ to $C_R$ and the charge removed from $C_R$ will be maintained. If $C_M$ changes, the ratio will also change to reflect the changed capacitance measured.

Figure 9:
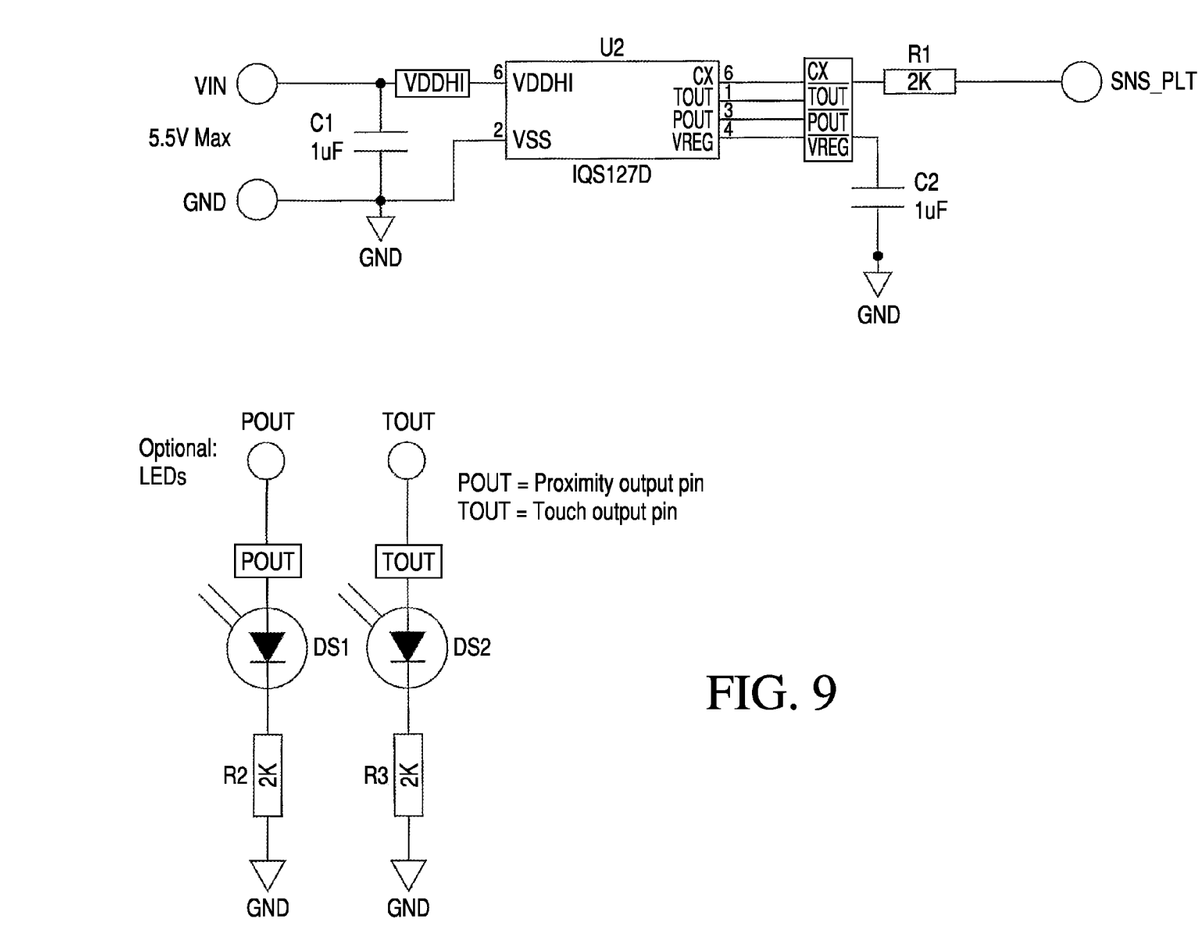
FIG. 9 shows a diagram of an integrated circuit using current mirror ratio technology and capacitive cancellation.

FIG. 9 shows a circuit diagram based on an integrated circuit from Azoteq (Pty) Ltd based on a charge transfer measurement method using current mirror ratios and capacitive cancellation techniques. It is apparent that only a few external components are required and that all $C_R$'s have been implemented on-chip. The implementation of current ratio structures makes the on-chip implementation of components practical and at the same time makes possible the selection and implementation on-chip of at least one such component, multiple components or combinations of such components.

The integrated circuit (U2) (IQS127 from Azoteq (Pty) Ltd) comprises all the building blocks for the capacitive measurement circuit including the current mirror for scaling the charge transferred from the sense plate (which is connected to pad SNS_PLT) to U2 and the capacitive cancellation circuit that contains several capacitors to select from to predetermine the capacitance that is removed. An external resistor $R_1$ is used to increase protection against electrostatic discharge (ESD) from the sense plate to U2. Capacitors $C_1$ and $C_2$ are for voltage regulation and help to assure a good, stable and noise free supply voltage to the IC U2. The device (U2) provides two outputs namely an indication of proximity detection on POUT, and a touch (i.e. much stronger capacitance variation detected) on TOUT.

Figure 10A:
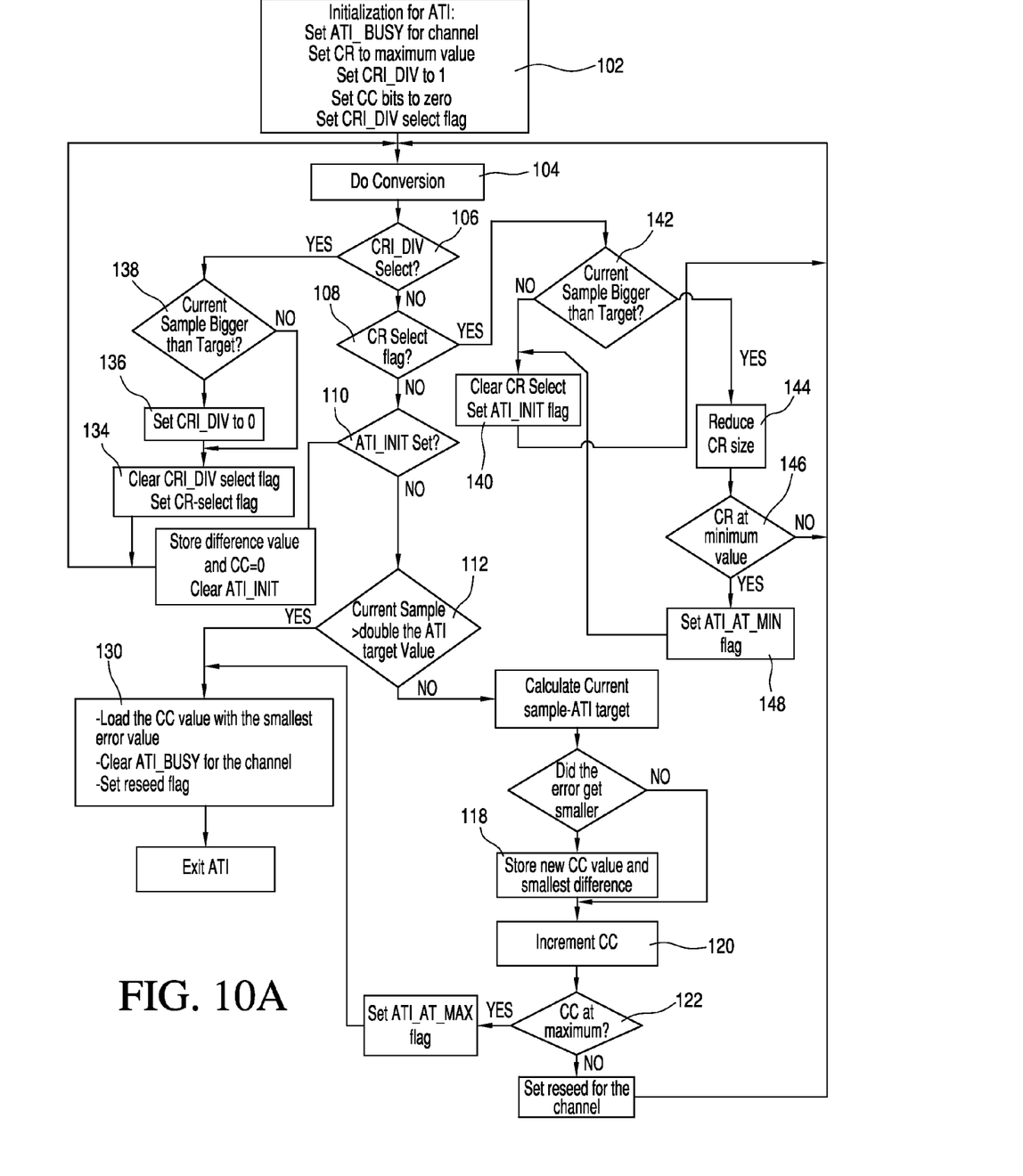
FIGS. 10A and 10B are respective flow charts of possible algorithms to implement an automatic adjustment of parameters (CR value or current mirror ratios of amount of capacitive cancellation) for performance based on two specific metrics.
Figure 10B:
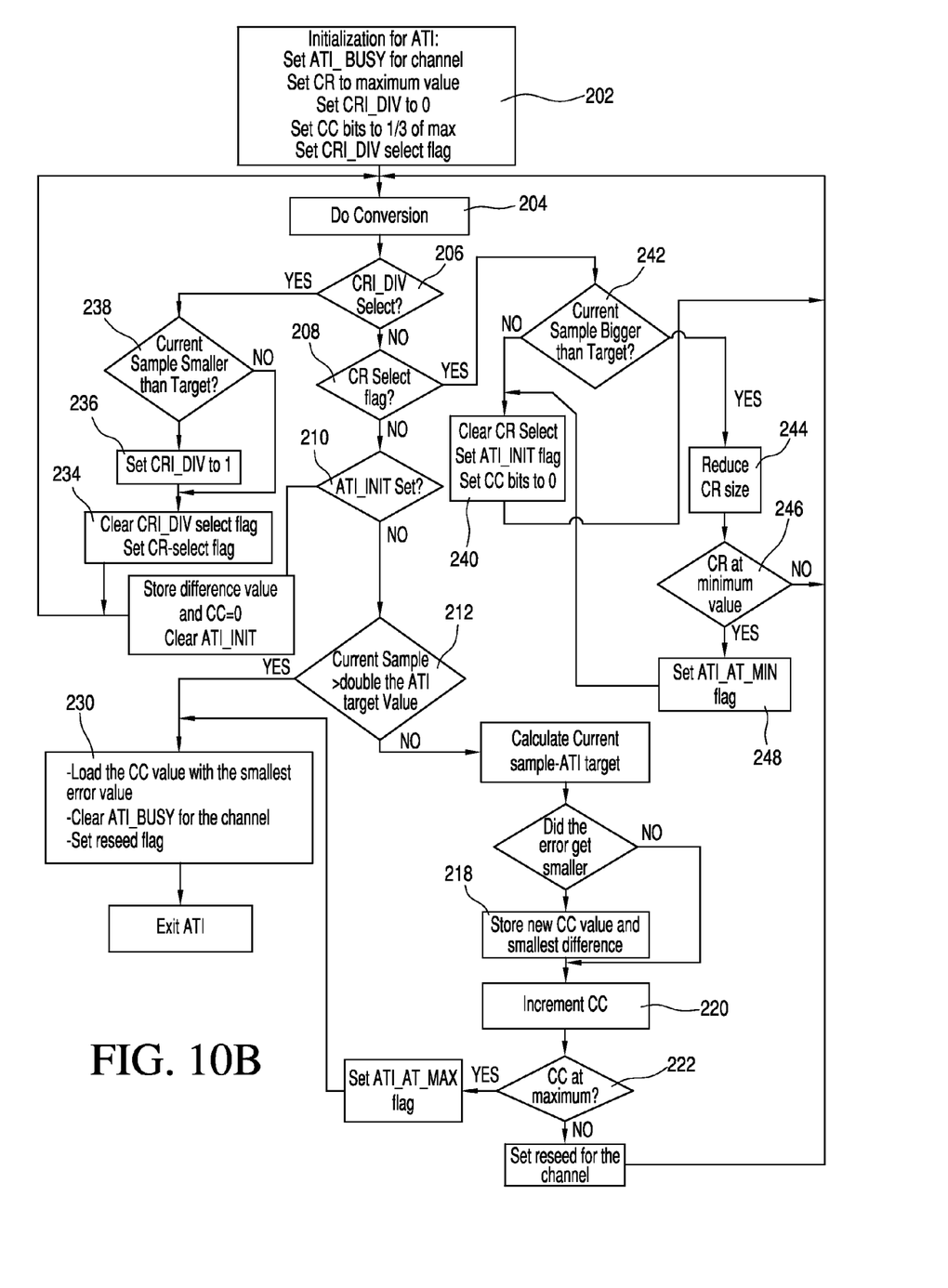

FIGS. 10A and 10B are two flow charts of respective algorithms for automatic adjustment of parameters to achieve certain performance objectives. The algorithm in FIG. 10A uses the largest acceptable size of $C_R$ as a metric to aim for and requires less capacitive cancellation to achieve a certain charge transfer count per cycle. The algorithm in FIG. 10B aims to have the largest acceptable capacitive cancellation amount and this results in a smaller $C_R$ value. The FIG. 10B algorithm also results in more sensitive settings for capacitive measurements. The current mirror ratios can also be used to interplay with the $C_R$ values or the capacitive cancellation.

Explanation of ATI Terms

| | |
|---|---|
| ATI | Antenna Tuning Implementation. |
| $C_R$ | Reference Capacitor (Four size selections) |
| CC Bits | Capacitance Cancellation size selection (0 to 256) |
| Current Sample | The number of charge transfers for the current sense channel |
| ATI Target | The preselected number of charge transfers that the ATI algorithm aims for |
| CRI_DIV | The $C_R$ current mirror divider ratio (0 = 32/1 = 128) |
| ATI_BUSY | Flag that indicates the ATI is in progress for the current sense channel |
| CRI_DIV Select flag | Flag to indicate the $C_R$ current mirror divider ratio must be selected |
| CR Select flag | Flag to indicate the $C_R$ size must be selected |
| ATI_INIT flag | Flag to indicate the initial difference (with all the PCC bits set to zero) between the current sample and the ATI target must be stored |
| ATI_AT_MIN flag | Flag to indicate the current sample cannot be adjusted lower |
| ATI_AT_MAX flag | Flag to indicate the current sample cannot be adjusted higher |
| Long Term Average | A filtered value of the current sample |
| Reseed Flag | Flag to indicate the long term average must be loaded with the current sample value |

Explanation of the ATI Algorithm

The aim of the ATI algorithm is to adjust the relevant parameters ($C_R$ size, $C_R$ current mirror ratio and the PCC bits) to get the current sample as close as possible to the ATI target count value. This will ensure that the circuit adjusts itself to obtain repeatable performance despite manufacturing and other tolerances.

The ATI algorithm can be implemented in a number of ways. Two possible algorithms are presented. The first algorithm in FIG. 10A (Stability Enhancement) will result in a big $C_R$ being selected with a smaller capacitive cancellation (CC) value. This produces a more stable system that is less sensitive and also less noise sensitive. The second algorithm in FIG. 10B (Sensitivity Enhancement) will result in the selection of a big CC value. This produces a more sensitive system that can be used to maximize proximity detection distance.

Algorithm 1 (Stability Enhancement)—FIG. 10A

During initialization for ATI [102], the ATI_BUSY flag is set to indicate to the system that ATI is in progress. The CC bits are set to zero, the current mirror divider ratio is set to a higher value and the $C_R$ size is set to a maximum value. The CRI_DIV Select flag is also set to force the system to do a determination if the higher value is the optimal selection.

The system then completes a charge transfer cycle [104]. If it is determined that the CRI_DIV Select flag is set [106] a test is done to check whether the current sample is bigger than the ATI target [138]. If it is bigger the current mirror divider ratio is changed to the lower value [136], the CRI_DIV Select flag is cleared and the CR Select flag is set [134] to force the selection of the appropriate $C_R$ size.

After the next charge transfer cycle is completed the CR Select flag is set [108]. The current sample is checked against the ATI target [142]. If the current sample is smaller than the ATI target the CR Select flag is cleared and the ATI_INIT flag is set [140] to start the process of determining the appropriate CC value to get the current sample the closest to the ATI target.

If the current sample is bigger than the ATI target the $C_R$ size is reduced [144] to the next smaller value until the current sample is smaller than the ATI target. If the minimum value of $C_R$ size is reached [146] the ATI_AT_MIN flag is set [148] to indicate the current sample cannot be adjusted any lower than its current value.

After the next charge transfer cycle is completed the ATI_INIT flag is set [110]. The current CC value (zero) is stored together with the difference between the current sample and the target [134]. The ATI_INIT flag is also cleared.

The algorithm will then keep increasing the CC value [120] and storing the smallest difference value and the CC value that yielded the smallest difference value [118] until either the current sample is at double the target value [112] or the maximum value for the CC is reached [122]. On either of these conditions the CC value that yielded the smallest difference in relation to the target is loaded and a reseed is forced [130].

Algorithm 2 (Sensitivity Enhancement)—FIG. 10B

During initialization for ATI [202], the ATI_BUSY flag is set to indicate to the system that ATI is in progress. The CC bits are set to a third of the maximum value. This will result in the algorithm selecting a smaller $C_R$ value with a higher CC value resulting in higher sensitivity. The current mirror divider ratio is set to the lower value and the $C_R$ size is set to the maximum value. The CRI_DIV Select flag is also set to force the system to do a determination if the lower value is the optimal selection.

The system then completes a charge transfer cycle [204]. If it is determined that the CRI_DIV Select flag is set [206] a test is done to check whether the current sample is smaller than the ATI target [238]. If it is smaller, the current mirror divider ratio is changed to the higher value [236], the CRI_DIV Select flag is cleared and the CR Select flag is set [234] to force the selection of the appropriate $C_R$ size.

After the next charge transfer cycle is completed the CR Select flag will be set [208]. The current sample is checked against the ATI target [242]. If the current sample is smaller than the ATI target the CR Select flag is cleared and the ATI_INIT flag is set [240] to start the process of determining the appropriate CC value to get the current sample the closest to the ATI target. The CC value is also set to zero.

If the current sample is bigger than the ATI target the $C_R$ size is reduced [244] to the next smaller value until the current sample is smaller than the ATI target. If the minimum value of $C_R$ size is reached the ATI_AT_MIN flag is set [248] to indicate the current sample cannot be adjusted any lower than its current value.

After the next charge transfer cycle is completed the ATI_INIT flag is set [210]. The current CC value (zero) is stored together with the difference between the current sample and the target [234]. The ATI_INIT flag is also cleared.

The algorithm will then keep increasing the CC value [220] and storing the smallest difference value and the CC value that yielded the smallest difference value [218] until either the current sample is at double the target value [212] or the maximum value for the CC is reached [222]. On either of these conditions the CC value that yielded the smallest difference in relation to the target is loaded and a reseed is forced [230]

Figure 11:
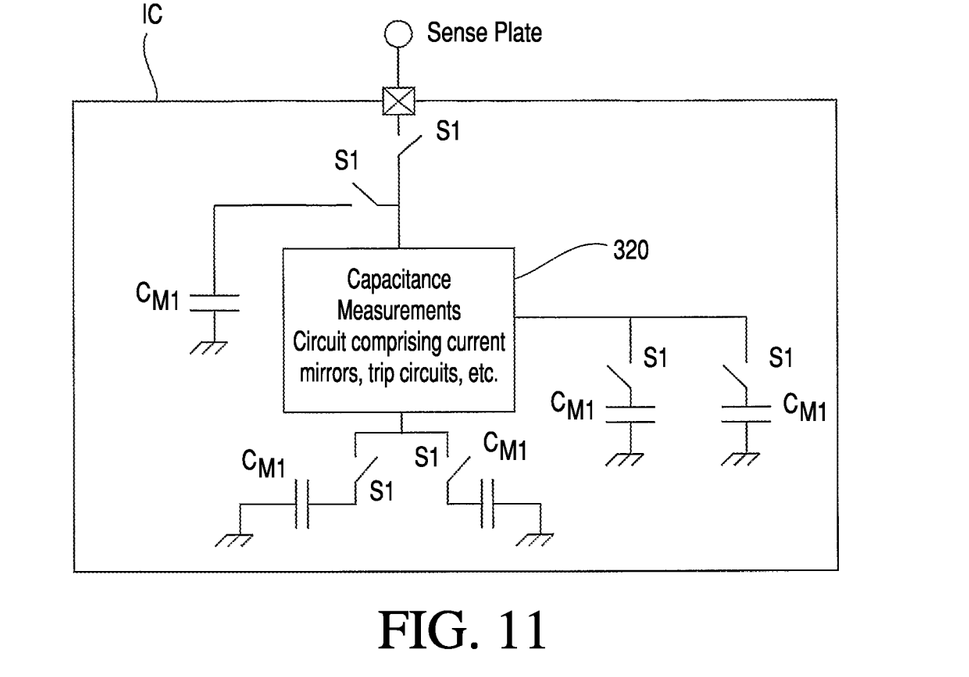
FIG. 11 shows a diagram for a circuit to detect the presence of RTS noise.

FIG. 11 illustrates an example of a circuit-noise detection structure which is specifically aimed at noise generated on-chip. An example of the type of noise is Random Telegraph Signal noise (RTS noise) which results in substantial steps in the measurements and which is it not typically Gaussian by nature. The normal implementation incorporates the sense plate, $C_{RX}$ (a reference capacitor for external measurement) and $C_{CX}$ (a reference capacitor for capacitance cancellation of the external sense plate), connected through switches $S_1$, $S_3$ and $S_5$ respectively to a measurement circuit (IC) 320. $S_1$ is the "PASS" switch in a charge transfer implementation. The "UP" switch is not shown. $C_{MI}$ (internal measurement capacitor) is used to emulate the operation of a sense plate. This is done wholly within the integrated circuit to avoid environmental influences. $C_{CI}$ defines the amount of charge to be removed for the internal measurement. It is important to incorporate as many elements of the circuit as possible for the internal measurement, within the IC.

It is possible but not essential for the internal and external measurements to work concurrently. For example, when one is in the "UP" phase, the other can do the "PASS" phase and vice versa. An additional trip circuit is required for the internal measurements. Detection of a step or change in measurement on the internal $C_{RI}$ indicates a change in the transfer function of the capacitance measurement circuit 320. This is then used for the filtering of the measurement data.

In one embodiment the detection of RTS noise in accordance with the preceding description triggers an analysis of the normal measurement data and an automatic learning algorithm is then implemented to model the noise manifestation from these measurements. It is then possible to remove the effects of this noise automatically from the measurement signal when the noise occurs or when it disappears.

In another embodiment the size (amplitude) of the internal noise is used to derive an effect (through scaling etc) of the noise on the normal measurement and the effect of the noise can be removed.

Various levels of complexity can be involved and this will depend on the requirements in the application and also on the processing resources available to the designers. In a simple form the indication or triggering of a proximity event detection is inhibited for a period when noise is detected.

Figure 12:
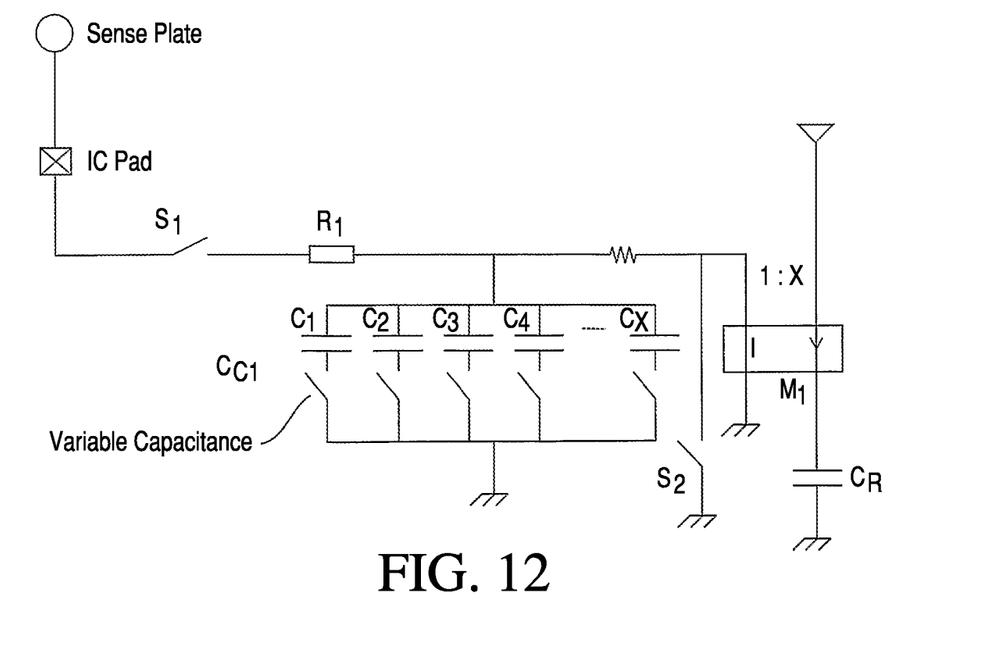
FIG. 12 shows an implementation for a capacitive cancellation circuit with the cancellation happening before the current mirror structure.

In analysis it has been found that noise is introduced into the current mirror structures and that when the capacitance cancellation is then performed this noise is amplified. FIG. 12 shows an implementation for capacitive cancellation to reduce or remove the effect of noise amplification when the charge removal is done after the current mirror.

A switch $S_1$ is a PASS switch that transfers the charge from the Sense Plate ($C_M$) to the current mirror (M1) that mirrors the charge which is transferred as per the ratio (1:X) into the $C_R$ where the charge is accumulated to be measured in some way. For example, a fixed trip level may be set and the number of transfers may be counted, or a fixed number of transfers may be done and then the voltage level may be measured with an A/D converter.

Essentially the charge from the sense plate is used to change the capacitors $C_1$ to $C_X$, (those connected) before the rest of the charge flows into the current mirror. When $S_1$ is later opened, a switch $S_2$ is closed to dump the charge that was accumulated in the capacitance cancellation capacitors. These capacitors must then be charged each time a charge transfer occurs.

In the measurement of small capacitance values the parasitic capacitance inherent in the capacitance cancellation structure may have a negative effect. In this case the structure may be pre-charged (but no cancellation capacitor is switched in) before the charge transfer cycle, to eliminate unwanted parasitic capacitance.

The capacitors $C_1$ to $C_X$ are not effectively used because the input to the current mirror only allows the current mirror to be charged to a threshold value at its input (~0.7V), whereas the sense plate is charged to a much higher voltage. Hence if these capacitors are pre-charged to a negative voltage it will help to improve size efficiency.

Figure 13:
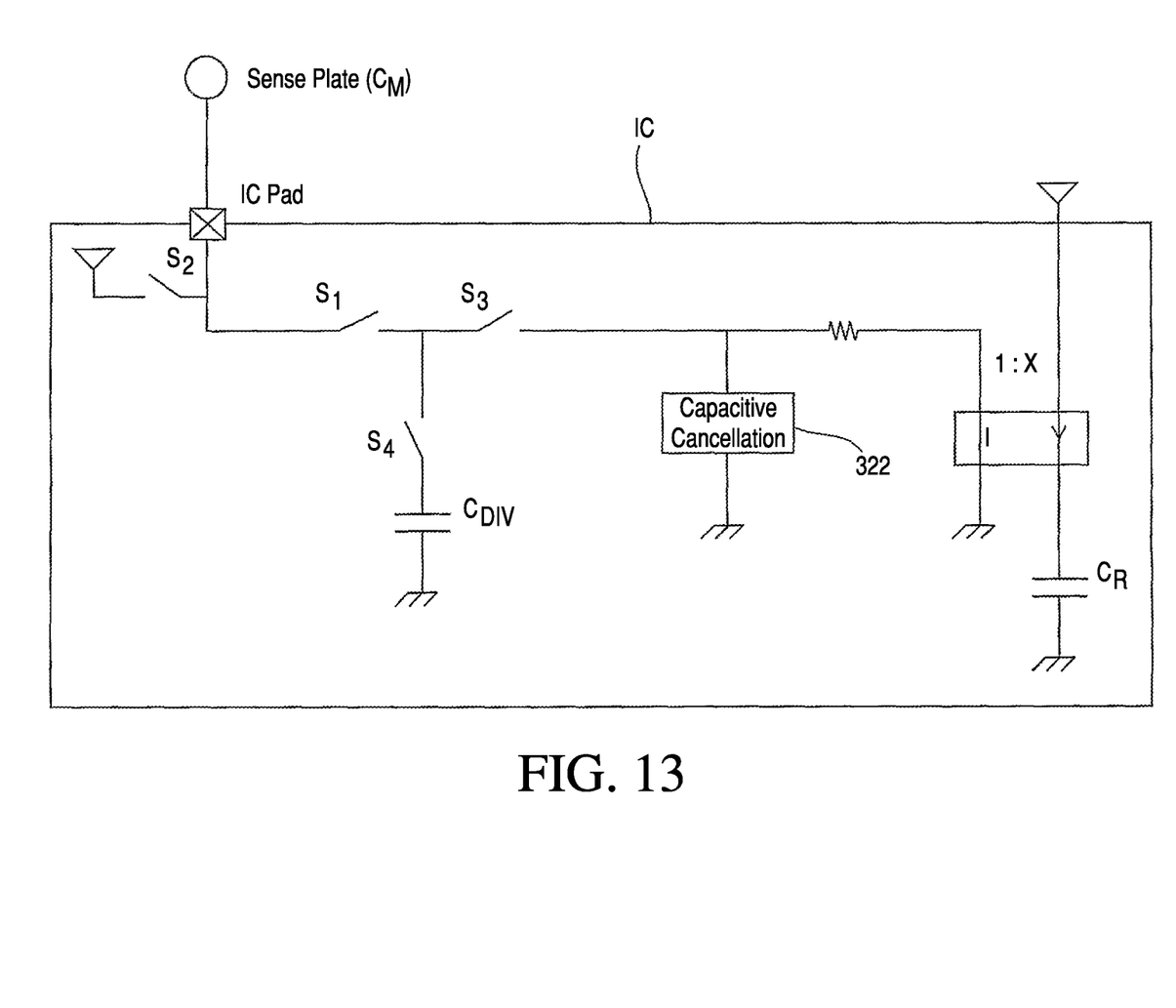
FIG. 13 shows a charge scaling capacitor on an input side to reduce the size of ratio required in a current mirror structure when large input capacitors are measured.

Experience has shown that noise is introduced through the current mirror structures. It has not been determined if higher ratios exacerbate this issue, but in another embodiment (shown in FIG. 13) a simple capacitive charge divider structure is implemented to achieve a scaling effect of the charge transferred from the sense plate ($C_M$) to the measurement circuit. This is important to keep on-chip components, such as capacitors and currents, within practical limits. In FIG. 13 the switch $S_2$ is closed to charge the sense plate which is effectively a capacitor $C_M$. A switch $S_2$ is then opened and $S_1$ is closed. This will "pass" the charge from the sense plate to the charge transfer measurement circuit. If $S_3$ is closed and $S_4$ is open the charge will be fully transferred and the capacitive cancellation circuit 322 will perform its function on this charge in accordance with its design.

When $S_1$ is closed, $S_3$ is open and $S_4$ is closed the charge from $C_M$ is divided between $C_M$ and $C_{DIV}$. In the next operation $S_1$ is opened and $S_3$ closed. The circuit then operates as before but the charge will have been divided according to the ratio of $C_M$ and $C_{DIV}$. When $S_1$ is opened the process to charge $C_M$ through $S_2$ can start again. It is also preferable that $C_{DIV}$ is chosen so that when the charge division is done, the voltage on $C_{DIV}$ is still higher than the input to the current mirror structure (typically a diode voltage drop). This can also be ensured by not discharging $C_{DIV}$ between each charge transfer cycle. This will change the ratio of charge division but can easily be calculated and accounted for.

The use of the $C_{DIV}$ approach reduces the sensitivity at very high values of $C_M$ but provides a large input range.

The invention claimed is:

1. An integrated circuit for measuring capacitance of a capacitive structure using a charge transfer technique, said circuit comprising means for transferring charge during each of a plurality of cycles during a capacitive measurement to a reference capacitor wherein the charge transferred from the measured capacitive structure and accumulated in the reference capacitor during every cycle in the capacitive measurement is reduced by a predetermined amount of charge, and wherein the charge transferred for measurement is scaled using a current mirror structure.

2. The integrated circuit of claim 1, wherein the current mirror structure includes a selection of scaling ratios that can be selected in accordance with an algorithm to optimize the capacitive measurement for a specific parameter.

3. The integrated circuit of claim 2, where said parameter is the stability of the measurement.

4. The integrated circuit of claim 1 wherein the reference capacitor is located on-chip in the integrated circuit.

5. The integrated circuit of claim 1 further including a number of selectable on-chip capacitors, and wherein the selection of said on-chip capacitors determines the amount of charge reduction during every cycle.

6. The integrated circuit of claim 1, wherein said amount of charge reduction is selected according to an algorithm which optimizes the capacitive measurement for a specific parameter.

7. The integrated circuit of claim 6, where said parameter is the sensitivity of the measurement.

8. The integrated circuit of claim 6, where said parameter is the speed of the measurement.

9. The integrated circuit of claim 6, where said parameter is the stability of the measurement.

10. The integrated circuit of claim 2, where said parameter is the speed of the measurement.

11. The integrated circuit of claim 2, where said parameter is the sensitivity of the measurement.

12. An integrated circuit for measuring capacitance of a capacitive structure using a charge transfer technique, said circuit comprising means for transferring charge during each of a plurality of cycles during a capacitive measurement to a reference capacitor wherein the charge transferred from the measured capacitive structure and accumulated in the reference capacitor during every cycle in the capacitive measurement is reduced by a predetermined amount of charge; and, wherein said integrated circuit further comprises a current mirror structure for scaling the amount of charge reduction during every cycle.

13. The integrated circuit of claim 12, wherein the reduction of charge is independent of the voltage across said reference capacitor.

14. The integrated circuit of claim 12, wherein the current mirror structure includes a selection of scaling ratios that can be selected in accordance with an algorithm to optimize the capacitive measurement for a specific parameter.

15. The integrated circuit of claim 14, where said parameter is the sensitivity of the measurement.

16. The integrated circuit of claim 14, where said parameter is the speed of the measurement.

17. The integrated circuit of claim 14, where said parameter is the stability of the measurement.

* * * * *